(12) United States Patent
Yu

(10) Patent No.: US 8,153,519 B1
(45) Date of Patent: Apr. 10, 2012

(54) METHOD FOR FABRICATING SEMICONDUCTOR DEVICE USING SPACER PATTERNING

(75) Inventor: Jae-Seon Yu, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/982,123

(22) Filed: Dec. 30, 2010

(30) Foreign Application Priority Data

Nov. 30, 2010 (KR) ........................ 10-2010-0120617

(51) Int. Cl.
*H01L 21/4763* (2006.01)
(52) U.S. Cl. ................. 438/637; 257/E21.577
(58) Field of Classification Search .................. 438/637; 257/E21.577
See application file for complete search history.

(56) References Cited

U.S. PATENT DOCUMENTS

2011/0065275 A1* 3/2011 Kim et al. ..................... 438/666
2011/0177691 A1* 7/2011 Kang ............................. 438/694

FOREIGN PATENT DOCUMENTS

| KR | 100876892 | 1/2009 |
| KR | 1020090044533 | 5/2009 |

OTHER PUBLICATIONS

Office Action issued by the Korean Intellectual Property Office on Jan. 18, 2012.

* cited by examiner

*Primary Examiner* — William D Coleman
(74) *Attorney, Agent, or Firm* — IP & T Group LLP

(57) ABSTRACT

A method for fabricating a semiconductor device includes depositing and stacking a hard mask layer and a sacrificial layer over an etch target layer forming a mask pattern with holes defined therein over the sacrificial layer, forming first pillars filling the holes; removing the mask pattern, forming second pillars by using the first pillars as an etch barrier and etching the sacrificial layer, forming spacers surrounding sidewalls of each second pillar, removing the second pillars, etching the hard mask layer by using the spacers as etch barriers to form a hard mask pattern, and forming a hole pattern by using the hard mask pattern as an etch barrier and etching the etch target layer.

20 Claims, 8 Drawing Sheets

METHOD FOR FABRICATING SEMICONDUCTOR DEVICE USING SPACER PATTERNING

CROSS-REFERENCE TO RELATED APPLICATIONS

The present application claims priority of Korean Patent Application No. 10-2010-0120617, filed on Nov. 30, 2010, which is incorporated herein by reference in its entirety.

BACKGROUND OF THE INVENTION

Exemplary embodiments of the present invention relate to a method for fabricating a semiconductor device, and more particularly, to a method for fabricating a semiconductor device using a spacer patterning technique.

Due to a limitation in the resolution of an exposure equipment, semiconductor devices of a scale lower than 40 nm are fabricated through a Mesh Spacer Patterning Technology (MSPT) process where a spacer patterning technology (SPT) is performed twice for fine patterning. The MSPT process, however, may include many procedural steps, and requires high fabrication costs and high procedural difficulty due to asymmetricity between a primary SPT process and a secondary SPT process.

To improve the MSPT process, a pillar-type Pillar SPT (PSPT) method has been suggested. According to the PSPT method, spacers are formed after a pillar-type photoresist (PR) mask is formed, and then a spacer at a position where four spacers meet may be used as a hole pattern. The PSPT process reduces not only the number of the procedural steps by more than 10 but also decreases the fabrication costs and the procedural difficulty, compared with the MSPT process.

However, it may be difficult to apply the PSPT process because pillar pattern should be formed using a photoresist mask and the photoresist mask may have small exposure margins, compared with hole pattern.

SUMMARY OF THE INVENTION

Exemplary embodiments of the present invention are directed to a semiconductor device fabrication method that may increase exposure margins during a spacer patterning process and alleviate technical limitations in an exposure process.

In accordance with an exemplary embodiment of the present invention, a method for fabricating a semiconductor device includes depositing and stacking a hard mask layer and a sacrificial layer over an etch target layer, forming a mask pattern with holes defined therein over the sacrificial layer, forming first pillars filling the holes; removing the mask pattern, forming second pillars by using the first pillars as an etch barrier and etching the sacrificial layer, forming spacers surrounding sidewalls of each second pillar, removing the second pillars etching the hard mask layer by using the spacers as etch barriers to form a hard mask pattern, and forming a hole pattern by using the hard mask pattern as an etch barrier and etching the etch target layer.

The forming of the first pillars filling the holes may include forming an oxide layer over a substrate structure to fill the holes, and performing an etch-back process onto the oxide layer to expose a surface of the mask pattern. The mask pattern may include a photoresist layer, and the oxide layer comprises an Ultra-Low Temperature Oxide (ULTO) formed at a temperature ranging from approximately 40° C. to approximately 150° C. The sacrificial layer may include a Spin-On Carbon (SOC) layer.

In accordance with another exemplary embodiment of the present invention, a method for fabricating a semiconductor device includes stacking a hard mask layer and a carbon layer over an insulation layer, forming a photoresist pattern with holes defined therein over the carbon layer, forming oxide pillars filling the holes, removing the photoresist pattern; forming carbon pillars by using the oxide pillars as an etch barrier and etching the carbon layer, forming oxide spacers surrounding sidewalls of each carbon pillar, removing the carbon pillars, etching the hard mask layer by using the oxide spacers as etch barriers to thereby form a hard mask pattern, and forming a hole pattern by using the hard mask pattern as an etch barrier and etching the insulation layer.

The oxide pillars and the oxide spacers may be formed of an ULTO. In the forming of the carbon pillars, an etch cross-section of each carbon pillar may have a vertical profile. In the etching of the hard mask layer, an etch cross-section of the hard mask layer may have a vertical profile. The number of the hole pattern may be twice as many as the number of the holes included by the photoresist pattern.

DESCRIPTION OF SPECIFIC EMBODIMENTS

Figure 1A:
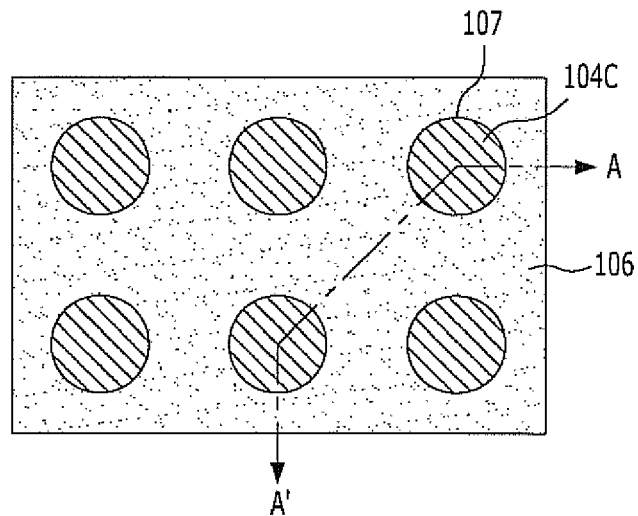
FIGS. 1A to 1H are plan views illustrating a method for fabricating a semiconductor device in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1B:
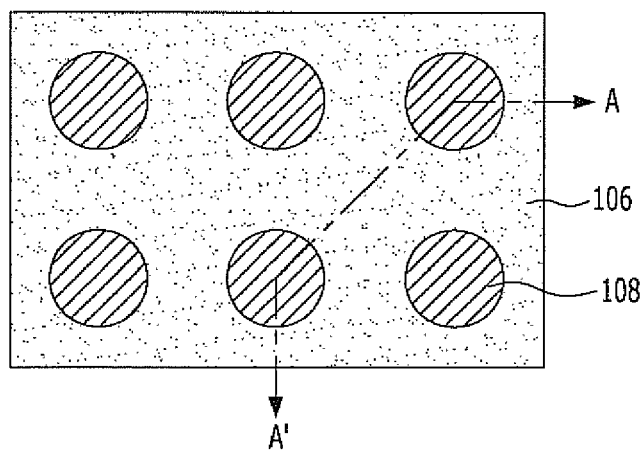
Figure 1C:
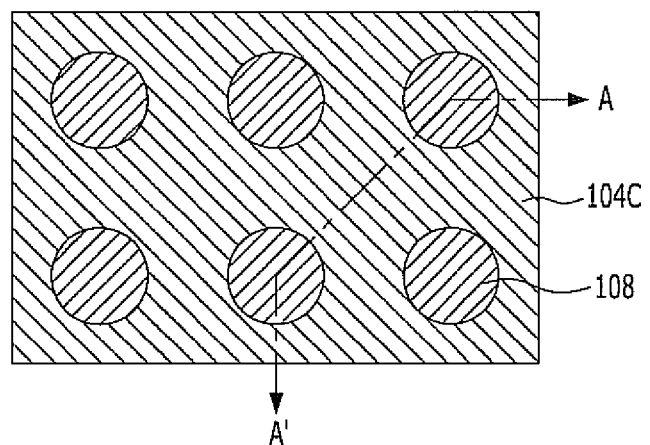
Figure 1D:
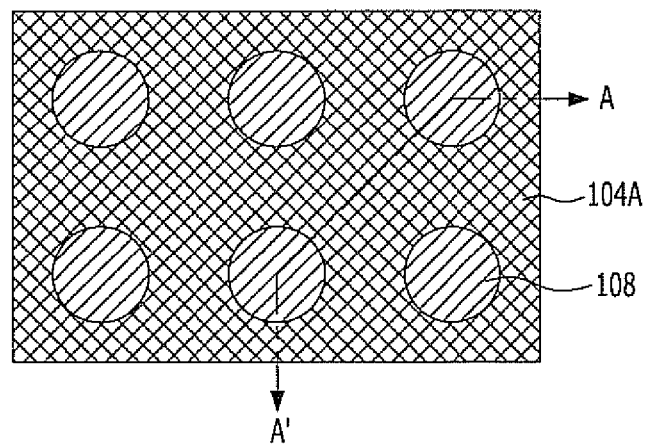
Figure 1E:
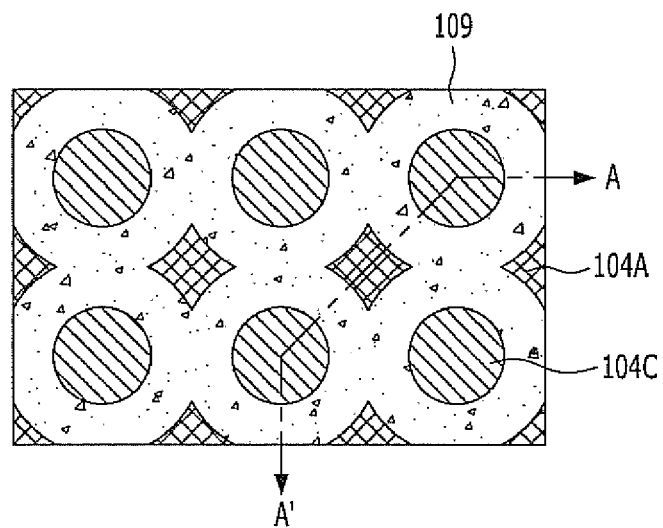
Figure 1F:
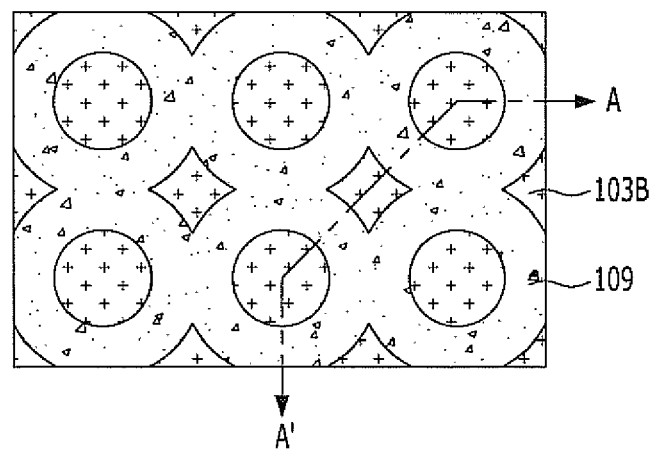
Figure 1G:
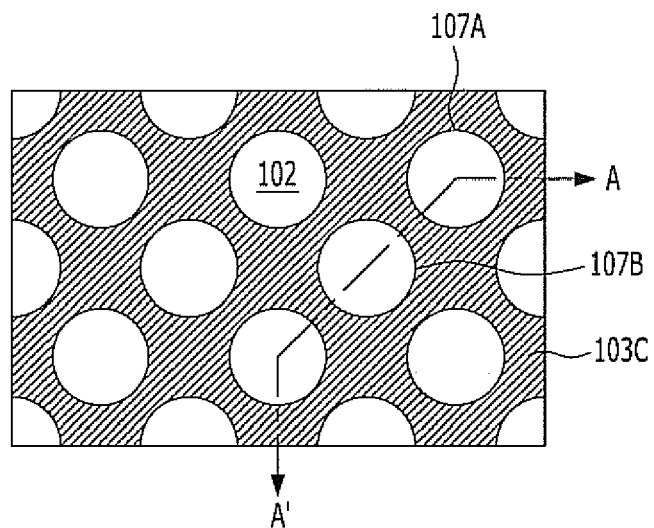
Figure 1H:
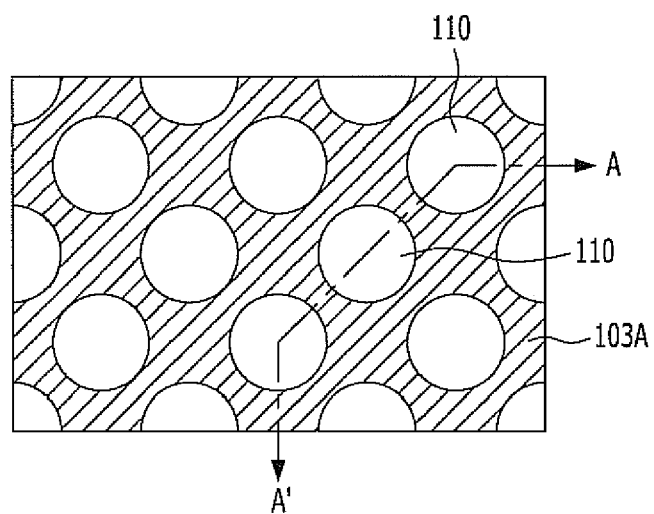
Figure 2A:
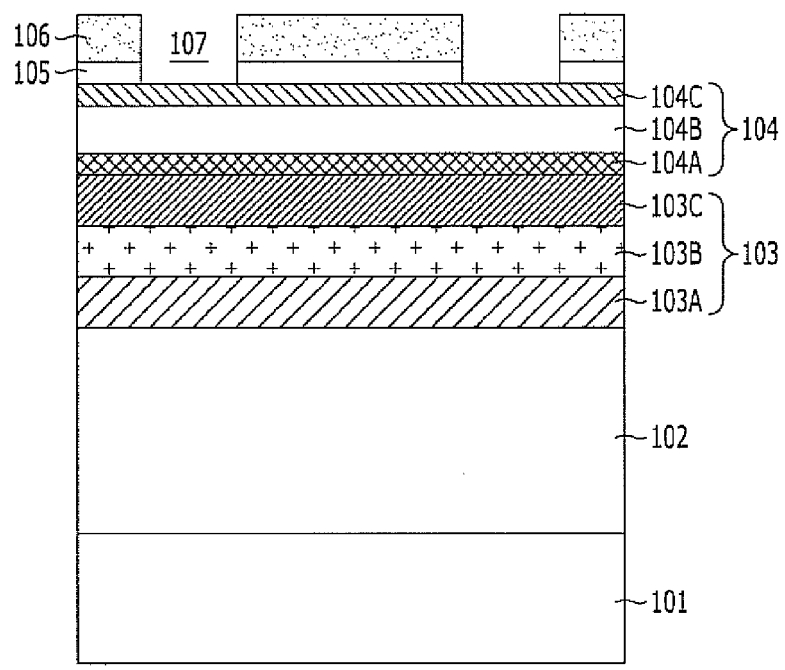
FIGS. 2A to 2H are cross-sectional views illustrating a method for fabricating a semiconductor device in accordance with an exemplary embodiment of the present invention.

FIGS. 1A to 1H are plan views illustrating a method for fabricating a semiconductor device in accordance with an exemplary embodiment of the present invention. FIGS. 2A to 1H are cross-sectional views illustrating a method for fabricating a semiconductor device in accordance with an exemplary embodiment of the present invention. The cross-sectional views of FIGS. 2A to 1H are obtained by cutting the structures of FIGS. 1A to 1H along a line A-A'.

Referring to FIGS. 1A and 2A, an etch target layer 102 is formed over a substrate 101. The substrate 101 includes a silicon substrate. Transistors, landing plugs, storage node contact plugs, bit lines, and bit line contact plugs may be formed over the substrate 101. The etch target layer 102 may be formed of an oxide layer and/or a nitride layer, and in this embodiment of the present invention, a first nitride layer, an oxide layer, and a second nitride layer are stacked as the etch target layer 102. The first nitride layer may be an etch stop layer, and the oxide layer may be an isolation layer between storage nodes. The second nitride layer may be a supporter between the storage nodes.

A hard mask layer 103 is formed over the etch target layer 102. The hard mask layer 103 has a stacked structure where more than three layers may be stacked. For example, the hard mask layer 103 may be formed by sequentially stacking a polysilicon hard mask layer 103A, an oxide hard mask layer 103B, and an amorphous carbon hard mask layer 103C. The polysilicon hard mask layer 103A includes any one among Low-Pressure Tetra Ethyl Ortho Silicate (LP-TEOS), Plasma-Enhanced TEOS (PE-TEOS), High-Density Plasma Oxide (HDP), and High-Temperature Oxide (HTO).

Subsequently, a sacrificial layer 104 is formed over the hard mask layer 103. The sacrificial layer 104 includes Spin-On Carbon (SOC). Also, the sacrificial layer 104 may be formed by sequentially stacking a first silicon oxynitride layer 104A, a spin-on carbon layer 104B, and a second silicon oxynitride layer 104C. Herein, the spin-on carbon layer 104B goes through a baking process after a coating process. The spin-on carbon layer 104B is coated and then baked at a temperature of approximately 250° C. to 550° C. in order not to be deformed and to have stability while the second silicon oxynitride layer 104C is deposited.

Subsequently, an anti-reflective layer 105 is formed over the sacrificial layer 104. The anti-reflective layer 105 is formed as an organic bottom anti-reflective coating (BARC) layer.

A hole-type mask pattern 106 is formed over the anti-reflective layer 105. The hole-type mask pattern 106 is formed by coating a photoresist layer, and exposing and developing the photoresist layer in a hole type. The mask pattern 106 is referred to as a partition pattern. The holes 107 are formed in the mask pattern as many as a half of the total number of contact holes, and the holes 107 may be formed in a circular hole shape in a plan view. Also, according to another exemplary embodiment of the present invention, in a plan view, the holes 107 may be formed in a rectangular shape as well.

Subsequently, the anti-reflective layer 105 is etched using the mask pattern 106 as an etch barrier. As a result, the anti-reflective layer 105 is patterned to have the same shape as the mask pattern 106. Since the shape of the mask pattern 106 is transferred to the anti-reflective layer 105, the anti-reflective layer 105 also has the holes 107. The hole of the mask pattern 106 may be patterned laterally in a minimum bias power of, e.g., 0 W so that the hole of the mask pattern 106 may have a critical dimension (CD) greater than the mask pattern hole 107 of the anti-reflective layer 105 This is referred to as a trimming. When the anti-reflective layer 105 is etched, oxygen ($O_2$) is used as an etch gas and hydrogen bromide (HBr), helium (He), and argon (Ar) are added as additive gas to increase selectivity. The height of the remaining mask pattern 106 is secured as high as possible. The second silicon oxynitride layer 104C of the sacrificial layer 104 is exposed below the holes 107.

Figure 2B:
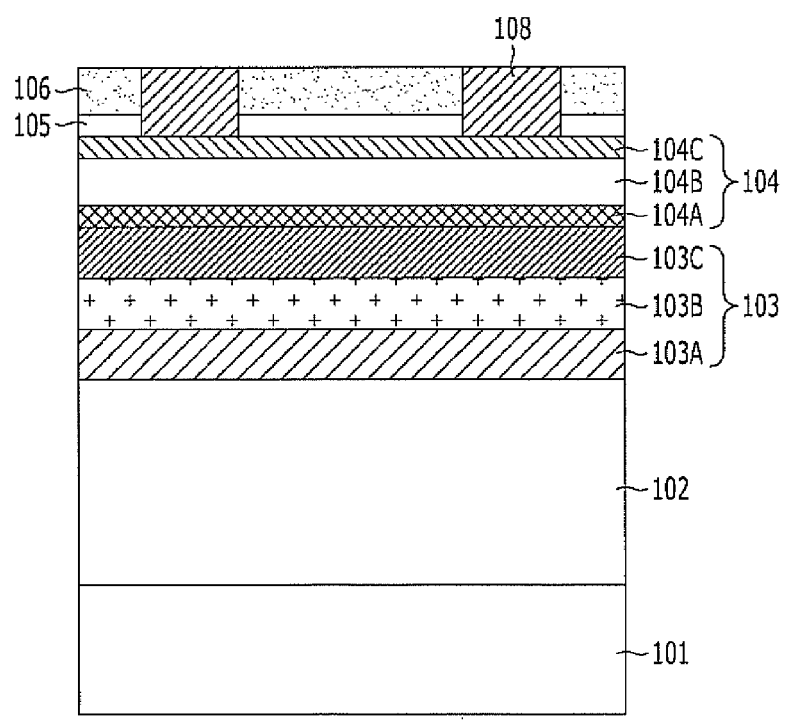

Referring to FIGS. 1B and 2B, first pillars 108 are formed in the inside of the mask pattern 106. The first pillars 108 fill the holes 107 and the first pillars 108 include an oxide. Therefore, the first pillars 108 are oxide pillars. The first pillars 108 are formed by forming an oxide layer over the resultant substrate structure to fill the holes 107 and selectively remove the oxide layer to expose the surface of the mask pattern 106. The oxide layer may be selectively removed by using an etch-back process. The oxide material used in forming the first pillars 108 may have excellent step coverage. For example, the oxide material used in forming the first pillars 108 may include any one selected among Ultra-Low Temperature Oxide (ULTO), Low-Pressure Tetra Ethyl Ortho Silicate (LP-TEOS), Plasma-Enhanced TEOS (PE-TEOS), High-Density Plasma Oxide (HDP), and High-Temperature Oxide (HTO). According to an embodiment, the first pillars 108 may be formed of ULTO. The ULTO is deposited through an Atomic Layer Deposition (ALD) process. The ULTO is formed at a temperature ranging from approximately 40° C. to 150° C., and $Si_2Cl_6$, $H_2O$ and pyridine are used as a source for the ULTO.

Figure 2C:
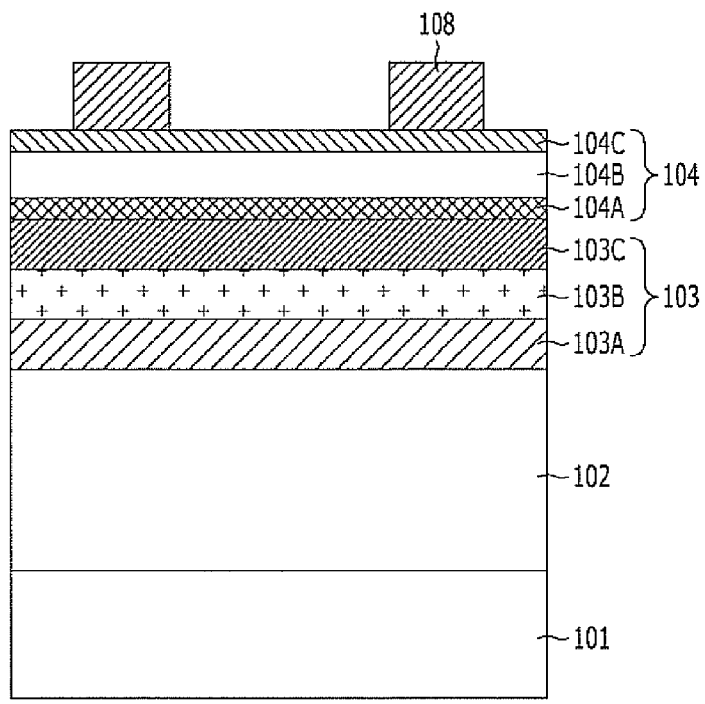

Referring to FIGS. 1C and 2C, the mask pattern 106 and the anti-reflective layer 105 are removed. The mask pattern 106 and the anti-reflective layer 105 are removed through a dry etch process. According to an exemplary embodiment, oxygen ($O_2$)-based plasma may be used.

When the mask pattern 106 and the anti-reflective layer 105 are removed, the first pillars 108 only remain and therefore, the sacrificial layer 104 under the first pillars 108, especially the second silicon oxynitride layer 104C, is exposed.

Figure 2D:
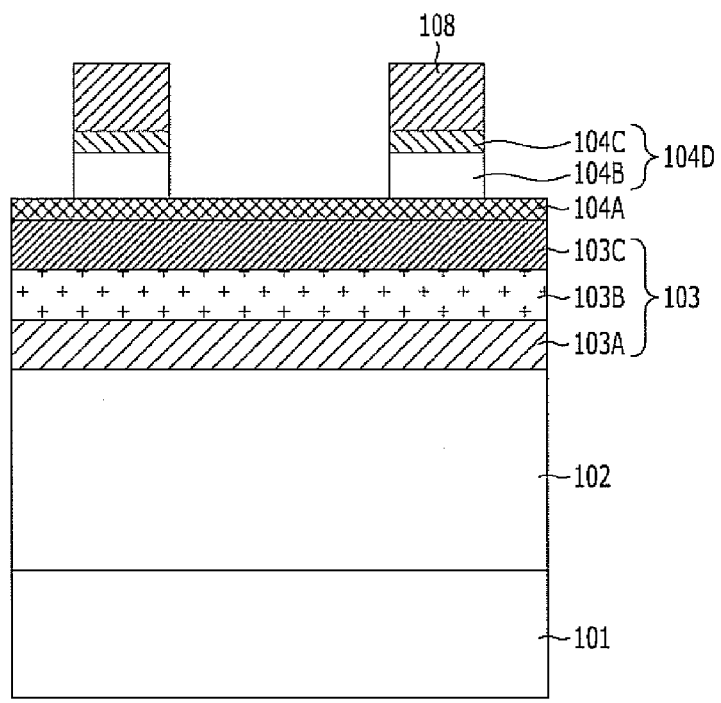

Referring to FIGS. 1D and 2D, the sacrificial layer 104 is etched using the first pillars 108 as an etch barrier. When the sacrificial layer 104 is etched, the second silicon oxynitride layer 104C and the spin-on carbon layer 104B are etched. As a result, second pillars 104D, where the spin-on carbon layer 104B and the second silicon oxynitride layer 104C are stacked, are formed under the first pillars 108, and the first silicon oxynitride layer 104A under the second pillars 104D is exposed. According to another exemplary embodiment, the first silicon oxynitride layer 104A of the sacrificial layer 104 may be etched out and thereby the uppermost amorphous carbon hard mask layer 103C may be exposed. The spin-on carbon layer 104B is etched to have an etch shape of a vertical cross-section so that vertical spacers may be formed when spacers are formed subsequently. To this end, the spin-on carbon layer 104B is etched by selectively adding and mixing nitrogen ($N_2$), chlorine ($Cl_2$), hydrogen bromide (HBr), methane ($CH_4$), silicon tetrachloride ($SiCl_4$), methyl fluoride ($CH_3F$) or nitrogen trifluoride ($NF_3$) to and with the oxygen ($O_2$) etch gas.

The second pillars 104D have the shape transferred by the first pillars 108. Since the second pillars 104D include the spin-on carbon layer 104B, it may be regarded as spin-on carbon pillars. The second pillars 104D are referred as sacrificial pillars since they are removed in a subsequent etch process.

Figure 2E:
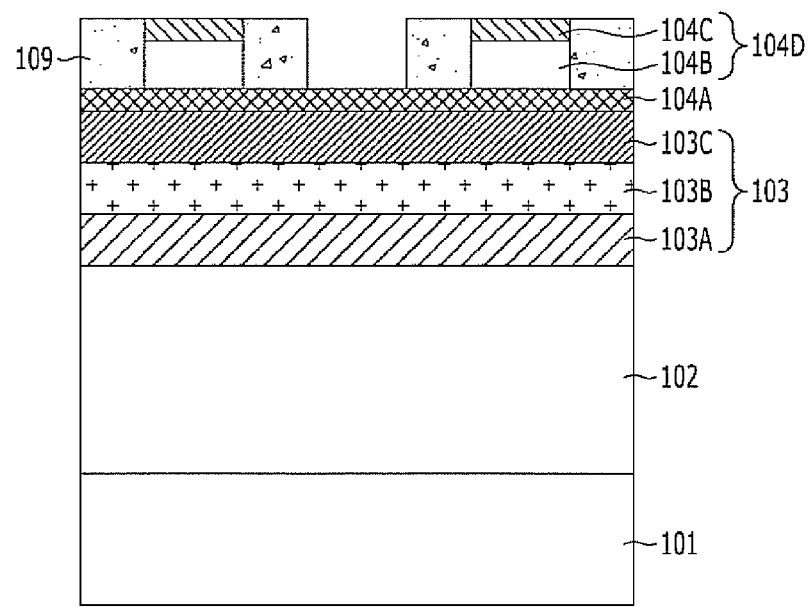

Referring to FIGS. 1E and 2E, after the first pillars 108 are removed, spacers 109 surrounding the sidewalls of each second pillar 104D are formed. The spacers 109 are formed by depositing an oxide layer over the resultant substrate structure including the second pillars 104D and then performing an etch back process. Accordingly, the spacers 109 are oxide spacers. When the oxide layer is etched to form the spacers 109, etch equipment using a Capacitively Coupled Plasma (CCP) source is used in order for the upper portions of the second pillars 104D to have an etch rate greater than that between the second pillars 104D. Herein, the pressure applied to the etch process ranges from approximately 10 mTorr to 30 mTorr.

Figure 2F:
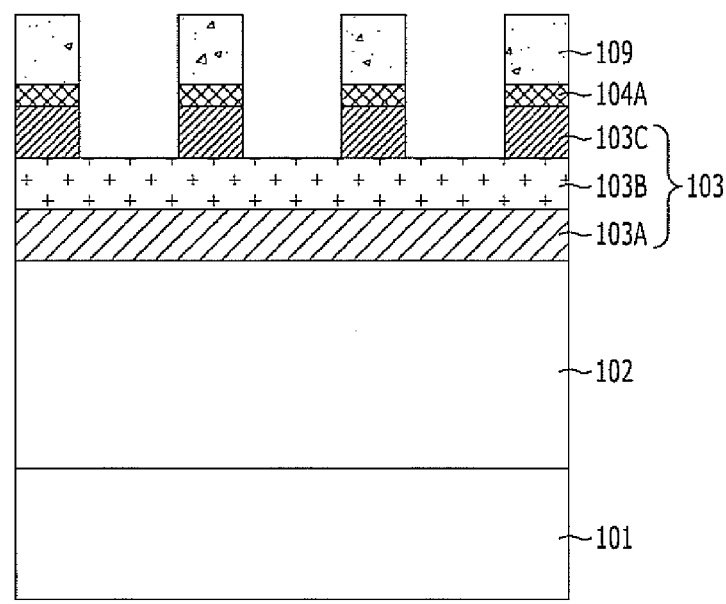

Referring to FIGS. 1F and 2F, the second pillars 104D are removed. At first, the first silicon oxynitride layer 104A and the amorphous carbon hard mask layer 103C, which is the uppermost layer of the hard mask layer 103, are etched using the spacers 109 as an etch barrier.

Figure 2G:
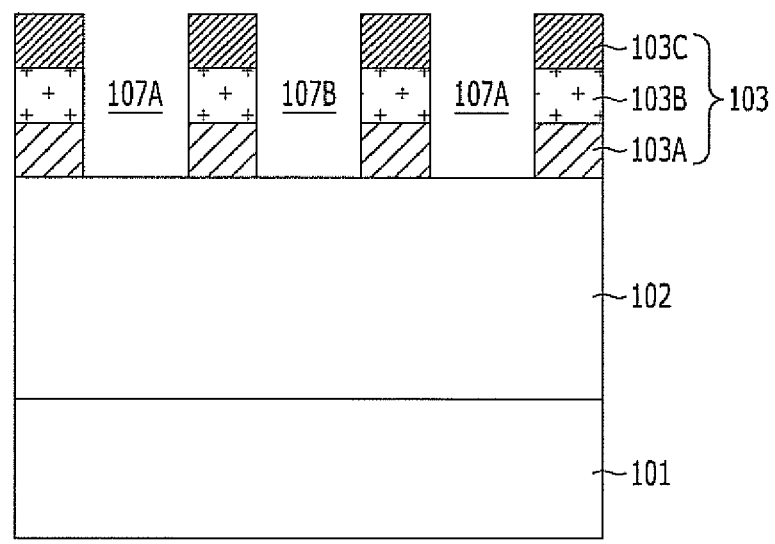

Subsequently, referring to FIGS. 1G and 2G, the oxide hard mask layer 103B and the polysilicon hard mask layer 103A are etched using the amorphous carbon hard mask layer 103C as an etch barrier. Herein, when the oxide hard mask layer 103B is etched, all the spacers 109 are consumed. Subsequently, the polysilicon hard mask layer 103A is etched using the remaining amorphous carbon hard mask layer 103C as an etch barrier. Subsequently, after the etch process using the spacers 109, the spacers 109 may be removed. This is because the spacers 109 are of an oxide and the oxide is all consumed when the oxide hard mask layer 103B is etched. When the polysilicon hard mask layer 103A is etched, any one gas selected among hydrogen bromide (HBr), nitrogen trifluoride ($NF_3$), nitrogen ($N_2$), oxygen ($O_2$), methane ($CH_4$), methyl fluoride ($CH_3F$), silicon tetrafluoride ($SiF_4$), and silicon tetrachloride ($SiCl_4$) may be selectively added to chlorine ($Cl_2$) gas so that the polysilicon hard mask layer 103A has an etch shape of a vertical cross-section.

As described above, when the hard mask layer 103 is etched through a series of processes which are described above, a hard mask pattern 103D is formed, and the hard mask pattern 103D has the shape transferred by the spacers 109. The hard mask pattern 103D includes first open regions 107A and second open regions 107B. The first open regions 107A and the second open regions 107B expose the etch target layer 102 disposed therebelow.

The first open regions 107A are formed by transferring the holes 107 of the photoresist pattern 106 (see FIG. 2A), and the second open regions 107B are added between the four first open regions 107A. The first open regions 107A and the second open regions 107B are the same in the size.

Figure 2H:
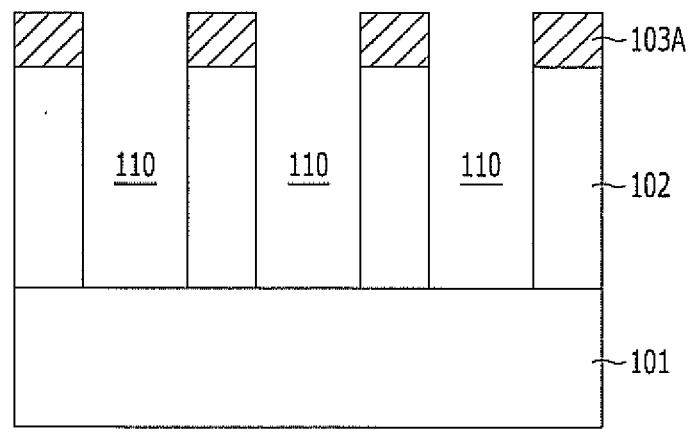

Referring to FIGS. 1H and 2H, the amorphous carbon hard mask layer 103C is removed. Subsequently, a hole pattern 110 is formed by using the remaining oxide hard mask layer 103B and the polysilicon hard mask layer 103A as etch barriers and etching the etch target layer 102. The hole pattern 110 are contact holes.

When the etch target layer 102 includes an oxide, the oxide hard mask layer 103B is not consumed but remains and the polysilicon hard mask layer 103A serves as the etch barrier. When the etch target layer 102 is etched, the bias power is raised as high as approximately 3000 W to approximately 8000 W to acquire high etch rate. Also, when the etch target layer 102 is etched, carbon fluoride-based gas ($C_xF_y$, x=2 to 5, and y=5 to 8), such as $C_4F_6$, $C_4F_8$, $C_5F_8$ and the like, is used as a main etch gas so that the etch target layer 102 may have an etch shape of a vertical cross-section. Also, $C_xF_yI$-based gas (x=2 to 3, and y=4 to 8), such as $C_2F_5I$ and $C_3F_7I$, is used as a main etch gas, and $CH_xF_y$-based gas (x=1 to 5, and y=0 to 8), such as $CH_2F_2$ and $CH_3F$, carbonyl sulfide (COS), oxygen ($O_2$), or silicon tetrachloride ($SiCl_4$) may be added as an additive gas, or argon (Ar) or xenon (Xe) gas may be added thereto for plasma stabilization and increased etch rate.

Although not illustrated in the drawing, after the polysilicon hard mask layer 103A is removed subsequently, storage nodes are formed inside the hole pattern 110. The storage nodes are formed in the form of pillars or cylinders.

According to the embodiment of the present invention, which is described above, when the mask pattern 106 is formed, the holes 107 are formed as many as a half of the total number of the cells so as to increase exposure margins, and the hole pattern 110 is formed as many as the total number of the cells by using the SPT technology with the spin-on carbon pillars which may be transferred from the oxide pillars after the formation of the oxide pillars.

The technology of the present invention increases exposure margins and overcomes technical limitations in an exposure process by forming a mask pattern in a hole type and using first pillars (which are of an oxide), second pillars (which are of a spin-on carbon), and spacers, which are to be formed after the formation of the mask pattern. Accordingly, fine linewidth may be formed and this increases net die and decreases production costs.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
   depositing and stacking a hard mask layer and a sacrificial layer over an etch target layer;
   forming a mask pattern with holes defined therein over the sacrificial layer;
   forming first pillars filling the holes;
   removing the mask pattern;
   forming second pillars by using the first pillars as an etch barrier and etching the sacrificial layer;
   forming spacers surrounding sidewalls of each second pillar;
   removing the second pillars;
   etching the hard mask layer by using the spacers as etch barriers to form a hard mask pattern; and
   forming a hole pattern by using the hard mask pattern as an etch barrier and etching the etch target layer.

2. The method of claim 1, wherein the forming of the first pillars filling the holes comprises:
   forming an oxide layer over a resultant substrate structure having the mask pattern to fill the holes; and
   performing an etch-back process onto the oxide layer to expose a surface of the mask pattern.

3. The method of claim 1, wherein the forming of the spacers comprises:
   forming an oxide layer over a resultant substrate structure including the second pillars; and
   performing an etch-back process onto the oxide layer.

4. The method of claim 1, wherein the forming a mask pattern with holes defined therein over the sacrificial layer comprising:
   forming an anti-reflective layer over the sacrificial layer;
   forming a hole-type mask pattern over the anti-reflective layer; and
   forming the holes by etching the anti-reflective layer using the hole-type mask pattern.

5. The method of claim 1, wherein the sacrificial layer comprises a Spin-On Carbon (SOC) layer.

6. The method of claim 1, wherein the sacrificial layer is formed by sequentially stacking a spin-on carbon layer and a silicon oxynitride layer.

7. The method of claim 1, wherein in the forming of the second pillars, an etch cross-section of each second pillar has a vertical profile.

8. The method of claim 1, wherein in the etching of the hard mask layer, an etch cross-section of the hard mask layer has a vertical profile.

9. The method of claim 1, wherein the hard mask layer is formed by sequentially stacking a polysilicon layer, an oxide layer, and an amorphous carbon layer.

10. The method of claim 1, wherein the number of the hole pattern is twice as many as the number of the holes included by the mask pattern.

11. The method of claim 2, wherein the mask pattern comprises a photoresist layer, and the oxide layer comprises an Ultra-Low Temperature Oxide (ULTO) formed at a temperature ranging from approximately 40° C. to approximately 150° C.

12. The method of claim 11, wherein $Si_2Cl_6$, $H_2O$ and pyridine are used as a source for the ULTO.

13. The method of claim 11, wherein the ULTO is formed through an Atomic Layer Deposition (ALD) process.

14. The method of claim 4, wherein the holes of the mask pattern are patterned laterally in a certain bias power.

15. A method for fabricating a semiconductor device, comprising:
    stacking a hard mask layer and a carbon layer over an insulation layer;
    forming a photoresist pattern with holes defined therein over the carbon layer;
    forming oxide pillars filling the holes;
    removing the photoresist pattern;
    forming carbon pillars by using the oxide pillars as an etch barrier and etching the carbon layer;
    forming oxide spacers surrounding sidewalls of each carbon pillar;
    removing the carbon pillars;
    etching the hard mask layer by using the oxide spacers as etch barriers to form a hard mask pattern; and
    forming a hole pattern by using the hard mask pattern as an etch barrier and etching the insulation layer.

16. The method of claim 15, wherein the hard mask layer is formed by sequentially stacking a polysilicon layer, an oxide layer, and an amorphous carbon layer.

17. The method of claim 15, wherein the oxide pillars and the oxide spacers are formed of an Ultra-Low Temperature Oxide (ULTO).

18. The method of claim 15, wherein in the forming of the carbon pillars, an etch cross-section of each carbon pillar has a vertical profile.

19. The method of claim 15, wherein in the etching of the hard mask layer, an etch cross-section of the hard mask layer has a vertical profile.

20. The method of claim 15, wherein the number of the hole pattern is twice as many as the number of the holes included by the photoresist pattern.

* * * * *